United States Patent
Li (10) Patent No.: US 12,243,615 B2
(45) Date of Patent: Mar. 4, 2025

(54) CALIBRATION CIRCUIT AND METHOD WITH REFERENCE VOLTAGE GENERATOR AND COMPARATOR

(71) Applicant: CHANGXIN MEMORY TECHNOLOGIES, INC., Hefei (CN)

(72) Inventor: Siman Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 164 days.

(21) Appl. No.: 18/152,945

(22) Filed: Jan. 11, 2023

(65) Prior Publication Data

US 2023/0326497 A1  Oct. 12, 2023

(30) Foreign Application Priority Data

Apr. 12, 2022  (CN) .......................... 202210379098.0

(51) Int. Cl.
*G11C 7/10* (2006.01)
*H03K 19/00* (2006.01)

(52) U.S. Cl.
CPC ....... *G11C 7/1048* (2013.01); *H03K 19/0005* (2013.01); *G11C 2207/2254* (2013.01)

(58) Field of Classification Search
CPC ................ G11C 7/1048; G11C 7/1084; G11C 2207/2254; G11C 11/4093; G11C 11/401; G11C 29/50004; G11C 5/147; G11C 2029/5004; H03K 19/0005

See application file for complete search history.

(56) References Cited

U.S. PATENT DOCUMENTS

| | | | |
|---|---|---|---|
| 9,825,631 B1 | 11/2017 | Cho et al. | |
| 10,680,634 B1 * | 6/2020 | Gharibdoust | ......... H03M 1/069 |
| 2017/0213667 A1 * | 7/2017 | Savchenko | ............ H01H 13/70 |
| 2022/0115046 A1 * | 4/2022 | Kang | ............... G11C 29/50008 |

FOREIGN PATENT DOCUMENTS

CN  107393576 B  10/2020

\* cited by examiner

*Primary Examiner* — Sultana Begum
(74) *Attorney, Agent, or Firm* — Syncoda LLC; Feng Ma (57) ABSTRACT

The present disclosure provides a calibration circuit, a memory, and a calibration method. The calibration circuit includes: a calibration resistance module, wherein an output voltage of the calibration resistance module varies with a first parameter, and the first parameter includes at least one of a fabrication process of the calibration circuit, a power supply voltage of the calibration circuit, or an operating temperature of the calibration circuit; a reference voltage generation module, configured to receive a first comparison signal, to generate a corresponding reference voltage; and a comparison module, coupled to the calibration resistance module and the reference voltage generation module, and configured to compare the output voltage with the reference voltage and generate the first comparison signal.

13 Claims, 4 Drawing Sheets

CALIBRATION CIRCUIT AND METHOD WITH REFERENCE VOLTAGE GENERATOR AND COMPARATOR

CROSS-REFERENCE TO RELATED APPLICATION

This application claims the priority of Chinese Patent Application No. 202210379098.0, submitted to the Chinese Intellectual Property Office on Apr. 12, 2022, the disclosure of which is incorporated herein in its entirety by reference.

TECHNICAL FIELD

The present disclosure relates to, but is not limited to, a calibration circuit, a memory, and a calibration method.

BACKGROUND

In integrated circuits such as a dynamic random access memory (DRAM), some resistors in the integrated circuits are affected by process, voltage, temperature (PVT).

To solve the above problem, a calibration circuit is required to calibrate resistances of the resistors. The calibration circuit usually calibrates the resistances of the resistors in response to a calibration command or periodically, which cannot meet accurate calibration requirements.

SUMMARY

An overview of the subject described in detail in the present disclosure is provided below. This overview is not intended to limit the protection scope of the claims.

The present disclosure provides a calibration circuit, a memory, and a calibration method.

According to a first aspect of embodiments of the present disclosure, a calibration circuit is provided. The calibration circuit includes:
- a calibration resistance module, wherein an output voltage of the calibration resistance module varies with a first parameter, and the first parameter includes at least one of a fabrication process of the calibration circuit, a power supply voltage of the calibration circuit, or an operating temperature of the calibration circuit;
- a reference voltage generation module, configured to receive a first comparison signal, to generate a corresponding reference voltage; and
- a comparison module, coupled to the calibration resistance module and the reference voltage generation module, and configured to compare the output voltage with the reference voltage and generate the first comparison signal.

A second aspect of the present disclosure provides a memory. The memory includes: a controller and the calibration circuit as described above; wherein the controller is configured to send a calibration control signal to the calibration circuit.

A third aspect of the present disclosure provides a calibration method. The calibration method includes:
- within a first time, adjusting, by the calibration circuit, an impedance of a calibration resistance module according to an initial calibration signal to generate an initial output voltage;
- within a second time, generating, by the calibration circuit, a corresponding reference voltage according to a first comparison signal, wherein an output voltage of the calibration resistance module varies with a first parameter, and the first parameter includes at least one of a fabrication process of the calibration circuit, a power supply voltage of the calibration circuit, and an operating temperature of the calibration circuit; and
- comparing the output voltage with the reference voltage, and generating the first comparison signal.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

Reference Numerals: 100—Calibration resistance module; 110—Calibration resistance submodule; 111—Transistor; 112—Second resistor; 120—Third resistor; 200—Reference voltage generation module; 210—First resistor; 220—Switch; 230—First code generator; 300—Comparison module; 310—Comparator; 320—Counter; 400—Latch.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A double data rate (DDR) memory has high requirements on the working environment. If a signal sent previously cannot be completely absorbed by a terminal of a circuit to form a reflection phenomenon on the circuit, a subsequent signal may be affected to cause an operation error. Therefore, it is necessary to solve this problem by using a termination resistor. The so-called termination is to allow the signal to be absorbed by the terminal of the circuit without forming a reflection on the circuit, which affects the subsequent signal. Since each data line needs at least one termination resistor, which means that a large number of termination resistors are required on each DDR mainboard, and also virtually increases the production cost of the mainboard. Moreover, different memory modules cannot have exactly the same requirements for the termination resistors, which also causes the so-called "memory compatibility problem".

On this basis, the solution of on-die termination (ODT) is proposed. That is, the termination resistor is transplanted into a chip, and there is no more termination circuit on the mainboard. In this way, a cleaner signal quality may be generated, resulting in a higher memory clock frequency speed, and the design of the mainboard may also be simplified to reduce the cost of the mainboard. Moreover, the termination resistor may be consistent with characteristics of memory particles, thereby reducing the compatibility problem between the memory and the mainboard.

Figure 1:
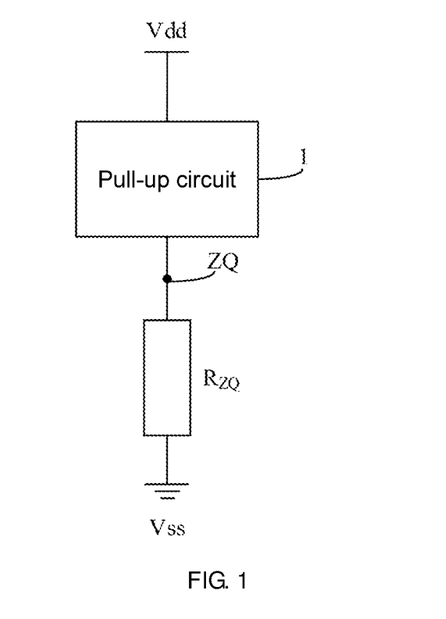
FIG. 1 and FIG. 2 are schematic diagrams of a circuit structure of a calibration solution in some examples.

Since the termination resistor may be affected by the PVT, a ZQ calibration circuit is required to calibrate the termination resistor. FIG. 1 shows a calibration solution in some examples, and in this calibration solution, the impedance on the chip of an integrated circuit is set by impedance matching to match an off-chip resistor. Referring to FIG. 1, a typical calibration solution involves connecting a pull-up circuit 1 between a positive power supply voltage Vdd and an off-chip resistor RZQ. The power supply voltages Vdd and Vss respectively refer to a positive power supply voltage and a reference power supply voltage, which are used for an input-output (I/O) circuit of the integrated circuit. As shown in FIG. 1, the reference power supply voltage Vss may be a ground voltage.

The strength of a pull-up circuit 1 is adjusted by changing a logic state to change the number of transistors that are turned on in the pull-up circuit 1 or by changing a bias voltage of the pull-up circuit until a voltage at a node ZQ between the pull-up circuit 1 and the off-chip resistor RZQ is equal to a reference voltage Vref supplied to the integrated circuit. The reference voltage is usually half of the power supply voltage Vdd, that is, Vref=½Vdd. In this case, the impedance of the pull-up circuit 1 may be equal to the impedance of the off-chip resistor RZQ. Specifically, since the voltage of the off-chip resistor RZQ and the voltage of the pull-up circuit 1 are equal (i.e., ½*Vdd), and since the off-chip resistor RZQ and the pull-up circuit 1 are connected in series, the current of the off-chip resistor RZQ and the current of the pull-up circuit 1 are also equal. Based on Ohm's law (resistance R=V/I), the resistance of the pull-up circuit 1 and the resistance of the off-chip resistor RZQ are therefore also equal.

Figure 2:
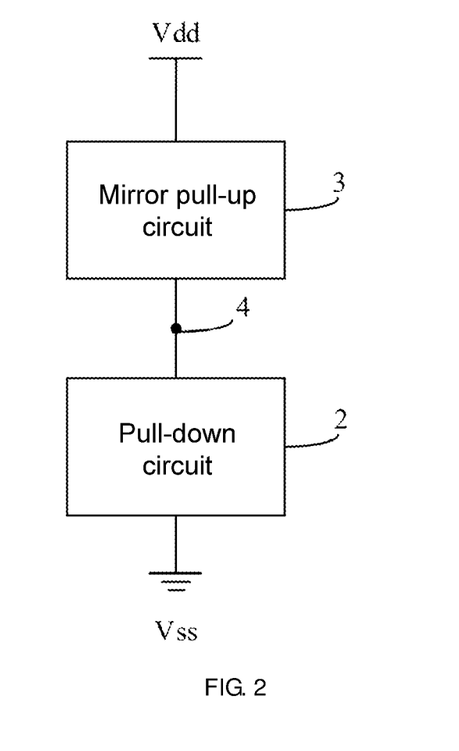

To set the impedance of a pull-down circuit, as shown in FIG. 2, a final logic state or bias condition for the pull-up circuit 1 is applied to a mirror pull-up circuit 3 connected in series to the pull-down circuit 2, the mirror pull-up circuit 3 is a mirror circuit of the pull-up circuit 1. When the impedance of the mirror pull-up circuit 3 is set to be equal to that of the off-chip resistor RZQ based on the applied bias condition, the mirror pull-up circuit 3 may then be configured to calibrate the pull-down circuit 2 using the same impedance matching principle. That is to say, the impedance of the pull-down circuit 2 is adjusted until the voltage at a common node 4 is equal to the reference voltage Vref which is half of the power supply voltage Vdd. Then, the impedance of the pull-down circuit 2 matches the impedance of the mirror pull-up circuit 3, and both are set to be equal to the impedance of the off-chip resistor RZQ. With the pull-up circuit 1 and the pull-down circuit 2 so calibrated, the logic state or bias condition of the circuit is stored, for example, as calibration control codes that include switch states of a plurality of transistors. Moreover, these calibration control codes may then be configured to set the termination resistor to a target value.

Figure 3:
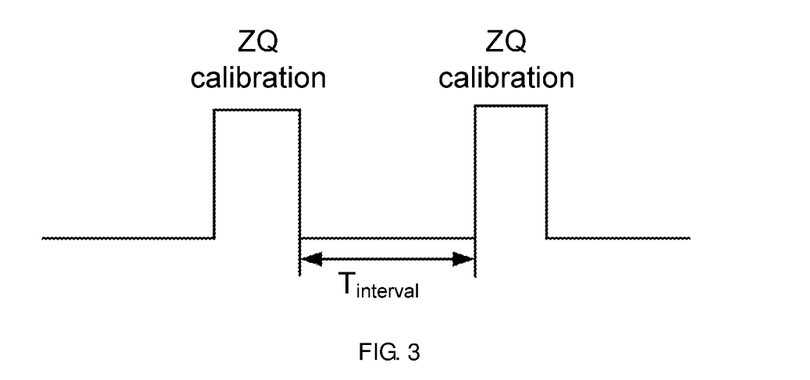
FIG. 3 is a timing diagram of calibration.

However, in the above calibration solution, the ZQ calibration circuit performs calibration on the resistance of the resistor in response to the calibration command or periodically. Within a time period after completing once calibration and before the next calibration, such as a time period $T_{interval}$ in FIG. 3, a certain calibration control code is always used. Moreover, during this time period, the PVT may still affect some circuit performance, resulting in inaccuracies in impedance calibration.

On this basis, the embodiments of the present disclosure provide a calibration circuit. The comparison module compares the output voltage with the reference voltage and generates the first comparison signal, and the reference voltage generation module can generate the reference voltage according to the first comparison signal. In this way, the first comparison signal can reflect the real-time change of the resistances of the resistors in the calibration resistance module, thereby reflecting the real-time change of the PVT, to meet more accurate calibration requirements.

Figure 4:
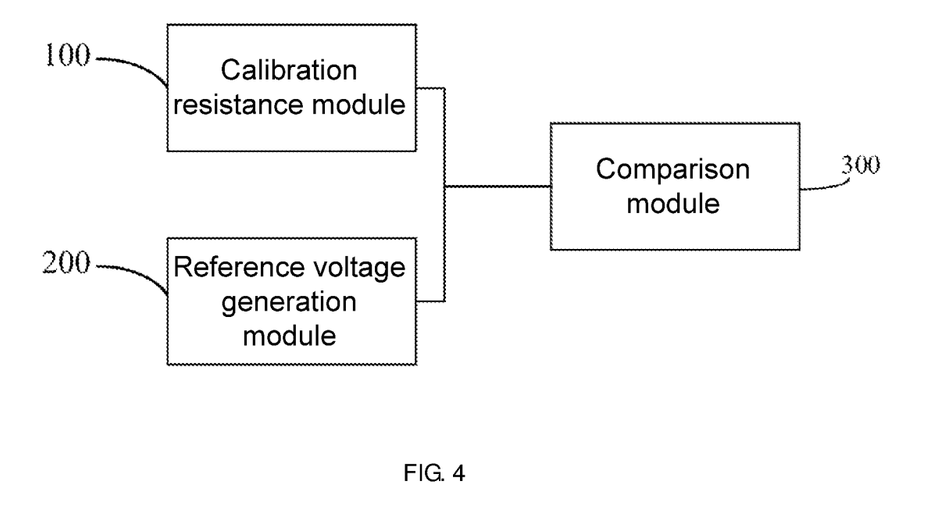
FIG. 4 is a schematic structural diagram of a calibration circuit according to one exemplary embodiment.

One exemplary embodiment of the present disclosure provides a calibration circuit. As shown in FIG. 4, the calibration circuit includes a calibration resistance module 100, a reference voltage generation module 200, and a comparison module 300. The output voltage of the calibration resistance module 100 varies with a first parameter, and the first parameter includes at least one of a fabrication process of the calibration circuit, a power supply voltage of the calibration circuit, or an operating temperature of the calibration circuit. That is, the variations of the output voltage of the calibration resistance module 100 can reflect the real-time change of the resistances of the resistors in the calibration resistance module 100. The reference voltage generation module 200 is configured to receive a first comparison signal and generate a corresponding reference voltage. The comparison module 300 is coupled to the calibration resistance module 100 and the reference voltage generation module 200, and is configured to compare the output voltage with the reference voltage and generate the first comparison signal.

In this embodiment, the reference voltage generation module 200 can generate the corresponding reference voltage according to the first comparison signal, and the comparison module 300 can compare the output voltage of the calibration resistance module 100 with the reference voltage of the reference voltage generation module 200 and generate the first comparison signal. In this way, the first comparison signal can reflect real-time change of the resistances of the resistors in the calibration resistance module 100, thereby reflecting the real-time change of the PVT, to meet more accurate calibration requirements. The first comparison signal can be applied to a circuit sensitive to the change of the PVT, such as a high-speed interface circuit.

It can be understood that, the calibration circuit provided by the present disclosure can be applied to the calibration of the termination resistor in the ODT, and can also be configured to calibrate other resistors inside the chip, which is not limited in the present disclosure.

Figure 5:
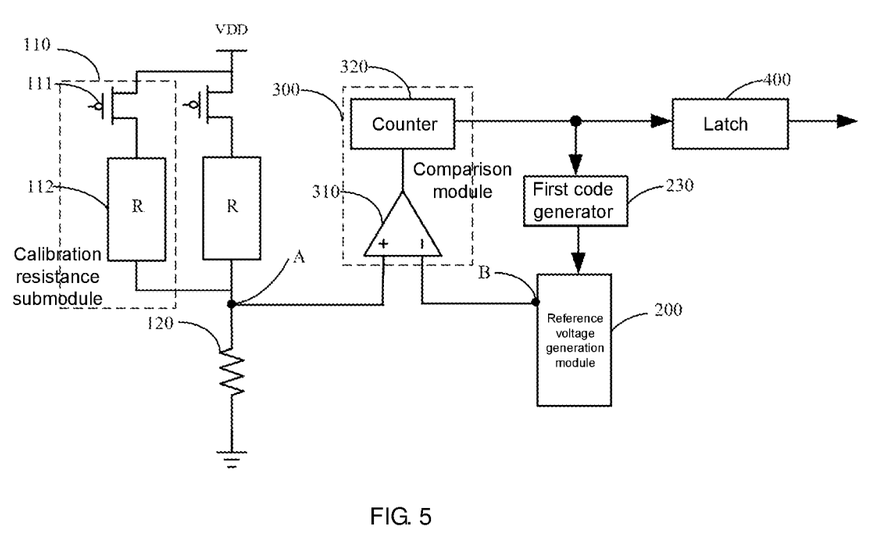
FIG. 5 is a structural diagram of a calibration circuit according to one exemplary embodiment.

In one exemplary embodiment of the present disclosure, as shown in FIG. 5, the calibration resistance module 100 includes multiple calibration resistance submodules 110 connected in parallel. The calibration resistance submodule 110 includes a transistor 111 and a second resistor 112 connected in series. The transistors 111 are all configured to receive an initial calibration signal, and are configured to be correspondingly turned on or off according to the initial calibration signal to generate an initial output voltage.

It can be understood that, the initial calibration signal may be a calibration control code signal generated after the original ZQ calibration circuit in the chip completes ZQ calibration once, and the calibration control code signal is directly inputted into each transistor 111. For example, the calibration resistance module 100 is mirrored with a calibration resistance network in the ZQ calibration circuit, or directly shares the calibration resistance module with the ZQ calibration circuit. In other embodiments, the calibration resistance module 100 is different from the calibration resistance network in the ZQ calibration circuit, so it is necessary to generate a third control code signal adapted to the calibration resistance module 100 according to the calibration control code signal, as long as at the moment of completing the ZQ calibration once, the output voltage of the calibration resistance module 100 is equal to the output voltage (such as the voltage at the node ZQ shown in FIG. 1) of the ZQ calibration circuit.

In this embodiment, the initial output voltage may be compared with the reference voltage to reflect the situation where the resistance in the calibration resistance module 100 changes for the first time after the ZQ calibration is completed once. For example, the reference voltage generation module 200 is further configured to generate an initial reference voltage according to the initial calibration signal, and the initial reference voltage is equal to the initial output voltage. In this way, after the ZQ calibration is completed once, the comparison module 300 can detect the change of the reference voltage when the reference voltage changes.

In some embodiments, there is one calibration resistance submodule 110. At this time, the bias level of the transistor 111 can be changed by changing the gate voltage of the transistor 111, thereby changing the resistance of the transistor 111. In these embodiments, the initial calibration signal represents the gate voltage of the transistor 111. In some other embodiments, there is one calibration resistance submodule 110. At this time, the resistance of a resistor network formed by the plurality of transistors 111 can be changed by changing the switch state and bias degree of each transistor 111. In these embodiments, the initial calibration signal represents the switch state of each transistor 111 and/or the gate voltage value of each transistor 111.

For example, each transistor 111 is a P-channel metal oxide semiconductor (PMOS) transistor. The transistor 111 is provided with a first terminal connected to a power supply terminal, a second terminal connected to a second resistor 112, and a control terminal for receiving the initial calibration signal. The first terminal of the transistor 111 may be a source or drain, and the second terminal of the transistor 111 is a drain or source. The initial calibration signal acts on the gate of each PMOS transistor, thereby controlling the on or off state of each PMOS transistor. For example, if there are 8 PMOS transistors, and the calibration signal is [0, 0, 0, 0, 0, 1, 1, 1], then among the 8 PMOS transistors, 5 PMOS transistors are in the on state, and 3 PMOS transistors are in the off state. Of course, it can be understood that the transistor 111 may also be an NMOS transistor.

In one exemplary embodiment, the calibration circuit further includes a third resistor 120. The third resistor 120 is coupled to the calibration resistance module 100. The third resistor 120 is a high-precision reference resistor, also called a standard resistor. For example, the third resistor 120 has a resistance of 240 ohms with an accuracy of ±1%. The third resistor 120 has high precision, and therefore is less affected by the PVT, to provide an accurate reference resistance. Referring to FIG. 5, the transistor 111 is provided with the first terminal connected to the power supply terminal, the second terminal connected to one terminal of the second resistor 112, and the control terminal for receiving the initial calibration signal. The other terminal of the second resistor 112 is coupled to the third resistor 120, such as one terminal of the third resistor 120. The other terminal of the third resistor 120 is connected to the ground terminal. Or, the transistor 111 is provided with the first terminal connected to the ground terminal and the second terminal connected to one terminal of the second resistor 112. The other terminal of the second resistor 112 is coupled to the third resistor 120, such as one terminal of the third resistor 120. The other terminal of the third resistor 120 is connected to the power supply terminal. For example, the output voltage of the calibration resistance module 100 is the voltage of the node A between the second resistor 112 and the third resistor 120.

Figure 6:
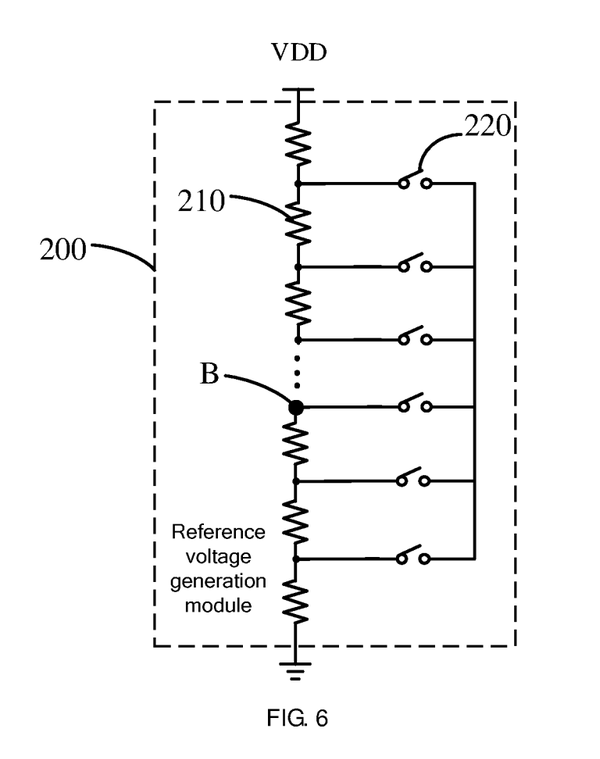
FIG. 6 is a circuit structural diagram of a reference voltage generation module in a calibration circuit according to one exemplary embodiment.

In one exemplary embodiment, the reference voltage generation module 200 includes a plurality of voltage division elements provided between the power supply terminal and the ground terminal. By controlling the number of voltage division elements connected into the circuit, the output voltage of a reference voltage output node B of the reference voltage generation module 200 can be controlled. For example, as shown in FIG. 6, the reference voltage generation module 200 includes a plurality of first resistors 210 connected in series, where two ends of each of the first resistors 210 are respectively connected in series to a switch 220. When the switches 220 at the two ends of the first resistor 210 are turned off, the first resistor 210 is in a short-circuit state. In this way, by controlling the on and off of the switches 220 at the two ends of the first resistor 210, the number of first resistors 210 connected into the circuit can be controlled, thereby changing the reference voltage outputted by the reference voltage generation module 200. For example, each switch 220 is provided with a first terminal connected to a node between adjacent two of the first resistors 210 and a second terminal connected to the reference voltage output node B, and the reference voltage output node B is connected to the comparison module 300 for outputting the reference voltage to the comparison module 300.

In this embodiment, the initial calibration signal can be directly inputted into the reference voltage generation module 200, and the switches 220 perform a switch operation in response to the initial calibration signal, such that the voltage at the reference voltage output node B is equal to the initial output voltage at the node A. For example, the initial calibration signal is only configured to control the on and off of each transistor 111. That is, when the transistors 111 are turned on, the resistances of the transistors 111 connected into the circuit are equal. The resistances of the first resistors 210 are also set to be equal, and the number of switches 220 is the same as the number of transistors 111. In this way, by setting the resistance of the first resistor 210, the on and off of each switch 220 can be directly controlled by using the initial calibration signal. For example, there are 8 transistors 111 and 8 switches 220, and the initial calibration signal is a control code [0, 0, 0, 0, 0, 1, 1, 1] for controlling the on and off of the transistors 111, where "0" represents a low level, "1" represents a high level, then the control code can be directly applied to the on and off control of each switch 220. That is, each switch 220 receives the above control code [0, 0, 0, 0, 0, 1, 1, 1] in sequence in a time-sharing manner, to act in response to the received high level or low level respectively, such that the voltage at the reference voltage output node B is equal to the voltage at the node A.

In other embodiments, the initial calibration signal may also be transformed accordingly. For example, the reference voltage generation module 200 further includes a second code generator (not shown in the figure) configured to generate a second control code signal in response to the initial calibration signal, and the second control code signal is configured to control the on and off of each switch 220, as long as the voltage at the reference voltage output node B is equal to the voltage at the node A. In this way, the number of first resistors 210 and the number of switches 220 can be flexibly set, and the resistances of the first resistors 210 can also be different, to adjust the variation gradient of the generated reference voltage and make the adjustment of the reference voltage more flexible.

The comparison module 300 is configured to compare the output voltage of the calibration resistance module 100 with the reference voltage of the reference voltage generation module 200 to generate a first comparison signal, to represent the resistance change of the resistors in the calibration resistance module 100. For example, the formula for calculating a turn-on resistance Ron of the transistor 111 is as follows:

$$Ron = \frac{1}{W/L\mu_p C_{ox}(VDD - Vth)}$$

where, W represents the channel width of the transistor;
L represents the channel length of the transistor;
μp represents the mobility of holes (correspondingly, PMOS is holes, and NMOS should be μn);
Cox represents the thickness of a gate oxide of the transistor;
VDD represents a saturation voltage; and
Vth represents a threshold voltage at which the transistor is turned on.

It can be seen from the above formula that when the PVT changes, the Ron also changes.

The resistance of the third resistor 120 is usually 240Ω. After the ZQ calibration circuit completes the ZQ calibration once, the state of the calibration resistance network in the ZQ calibration circuit is locked and unchanged. That is, after the ZQ calibration is completed once, and the initial calibration signal is sent to the calibration resistance module 100, the formula for calculating the initial output voltage, namely the voltage VA of the node A is as follows:

$$V_A = \frac{240}{RTT + 240}$$

where, RTT=Ron+R, and R is the resistance of the second resistor 112.

After once ZQ calibration is completed, and when the PVT changes, the Ron also changes, and thus the output voltage also changes. Moreover, the initial reference voltage generated by the current reference voltage generation module 200 is equal to the voltage at the node A during once ZQ calibration, and at this time, the output voltage is not equal to the reference voltage, thereby generating the first comparison signal. The change of the Ron can be determined according to the first comparison signal. For example, when the first comparison signal represents that the output voltage is greater than the reference voltage, it means that the RTT is reduced, and when the R is unchanged, it means that the resistance of the Ron is reduced; and when the first comparison signal represents that the output voltage is less than the reference voltage, it means that the RTT is increased, and when the R is unchanged, it means that the resistance of the Ron is increased.

In one exemplary embodiment, as shown in FIG. 5, the comparison module 300 includes a comparator 310 and a counter 320. The comparator 310 is provided with an input terminal for receiving the output voltage and the reference voltage and an output terminal connected to the counter 320, and is configured to compare the output voltage with the reference voltage to output a second comparison signal. The counter 320 is provided with an output terminal coupled to the reference voltage generation module 200, and is configured to count in response to the second comparison signal to generate the first comparison signal. For example, as shown in FIG. 5, the comparator 310 is provided with a first input terminal connected to a node between the calibration resistance module 100 and the third resistor 120, namely the node A, a second input terminal connected to the reference voltage output node B of the reference voltage generation module 200, and an output terminal connected to the counter 320. When the voltage at the node A is not equal to the voltage at the reference voltage output node B, the comparator 310 outputs the second comparison signal, and the counter 320 may perform a counting operation in response to the second comparison signal to generate the first comparison signal.

For example, when once ZQ calibration is finished, the value of the RTT is generally set to 240Ω to 240/4Ω, the initial value of the reference voltage is also set to a corresponding value with the calibration signal (for example, when the RTT is set to 240Ω, the voltage at the node A is 0.5*VDD, then the initial value at the reference voltage output node B is also set to 0.5*VDD). Assuming that the voltage at the node A drops to Vq, it means that the resistance of the RTT becomes larger, the comparator 310 compares and outputs the second comparison signal, and the counter 320 performs the counting operation in response to the second comparison signal.

To ensure that the comparison module 300 can always monitor the change of the PVT during a calibration interval, the reference voltage generation module 200 also generates the corresponding reference voltage according to the first comparison signal in real time, such that the voltage at the reference voltage output node B is equal to the voltage at the node A after the change. Thus, when the node A changes again, the comparator 310 can still detect the voltage change of the node A, and accurately reflect the resistance change information of the calibration resistance module 100 through the first comparison signal, such that the change of the PVT can be monitored all the time.

In an exemplary embodiment, as shown in FIG. 5, the reference voltage generation module 200 further includes a first code generator 230 configured to generate a first control code signal in response to the first comparison signal, and the first control code signal is configured to control the on-off of each switch 220, thereby adjusting the number of the first resistors 210 connected into the circuit in response to the first comparison signal, and adjusting the voltage at the reference voltage output node B. For example, the counter 320 performs the counting operation to increase or decrease the first control code signal. When the counter 320 outputs the first comparison signal, the first code generator 230 adjusts the first control code signal in response to the first comparison signal, for example, performs an operation of adding 1 or subtracting 1 to the first control code signal. The first control code signal is employed to adjust the number of first resistors 210 connected into the circuit, to change the voltage at the reference voltage output node B. After once adjustment is completed, the comparator 310 continues comparing the voltage at the node A and the voltage at the reference voltage output node B; if the two are equal, the second comparison signal is not output; and if the two are not equal, the second comparison signal is continued outputting, such that the counter 320 outputs the first comparison signal in response to the second comparison signal, to continue performing the operation of adding 1 or subtracting 1 to the first control code signal, thereby continuing changing the voltage at the reference voltage output node B, until the voltage at the reference voltage output node B is equal to the voltage at the node A. In this way, the first comparison signal can reflect dynamic change of the resistance of the calibration resistance module 100.

The above process is described in detail by taking an example where there are 6 switches 220 and 7 first resistors 210. The switches 220 may be transistors or metal switch elements. The first control code signal and the second control code signal may be configured to control the on and off of the switches 220. For example, the switches 220 are turned on in response to a high level and turned off in response to a low level. If the second control code signal is [0, 0, 0, 0, 1, 1], then the first four switches 220 are in the off state, the last two switches 220 are in the on state, the first five first resistors 210 and the last one first resistor 210 are connected into the circuit, and at this time, the voltage $V_B$ at the reference voltage output node B=⅙VDD. When the voltage $V_A$ at the node A is increased, the comparator 310 outputs a high level as the second comparison signal, the counter 320 performs the counting operation in response to the second comparison signal to generate the first comparison signal, and the first code generator 230 adjusts the first control code signal in response to the first comparison signal to perform the operation of adding 1 to the first control code signal, such that the first control code signal becomes [0, 0, 0, 1, 1, 1], then the first three switches 220 are in the off state, the last three switches 220 are in the on state, the first four first resistors 210 and the last one first resistor 210 are connected into the circuit, and at this time, the voltage $V_B$ at the reference voltage output node B becomes ⅓VDD. If $V_A$ and $V_B$ are equal, the comparator 310 does no longer generate the second comparison signal. If $V_A$ is still greater than $V_B$, the comparator 310 continues generating the second comparison signal, thereby continuing adjusting the $V_B$.

In one exemplary embodiment of the present disclosure, as shown in FIG. 5, furthermore, the calibration circuit further includes a latch 400 provided with an input terminal coupled to the comparison module 300 and an output terminal coupled to an internal circuit, and configured to latch the first comparison signal in response to a variation of the first comparison signal and output the first comparison signal to the internal circuit at a corresponding time. The internal circuit, such as a circuit more sensitive to the PVT, provides an accurate reference for the internal circuit.

In the calibration circuit provided in the embodiments of the present disclosure, the reference voltage generation module 200 and the comparison module 300 are provided. The reference voltage generation module 200 can generate the reference voltage according to the first comparison signal, and the comparison module 300 can compare the output voltage with the reference voltage and generate the first comparison signal. In this way, the first comparison signal can reflect real-time change of the resistances of the resistors in the calibration resistance module 100, thereby reflecting the real-time change of the PVT, to meet more accurate calibration requirements. One exemplary embodiment of the present disclosure provides a memory.

The memory includes: a controller and the calibration circuit as described above; wherein the controller is configured to send a calibration control signal to the calibration circuit. For example, the controller sends the initial calibration signal to the calibration circuit. The memory is, for example, a synchronous dynamic random-access memory (SDRAM). Of course, the memory may also be of other types, which is not limited in the present disclosure. For example, the memory includes an ODT circuit, and the calibration circuit is configured to calibrate an output impedance of the ODT circuit.

Figure 7:
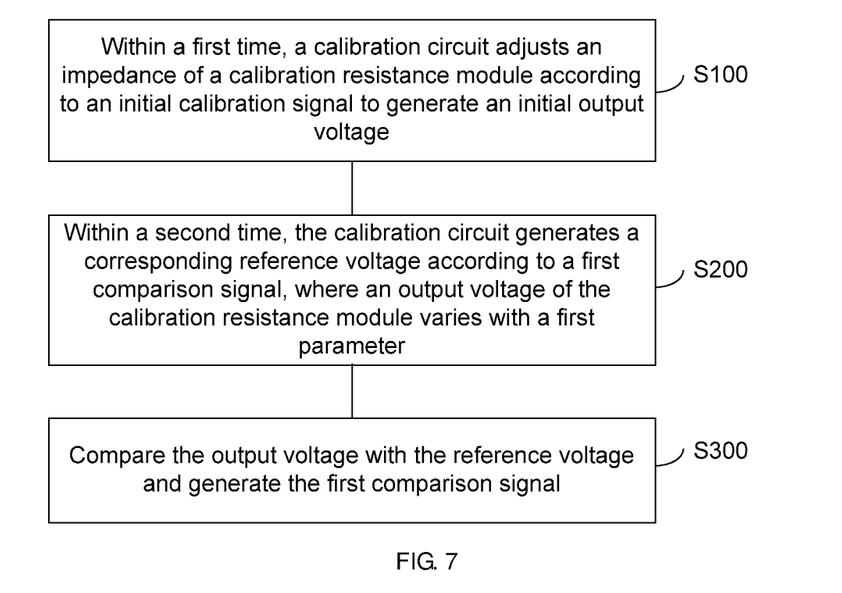
FIG. 7 is a flow diagram of a calibration method according to one exemplary embodiment.

One exemplary embodiment of the present disclosure provides a calibration method. As shown in FIG. 7, the calibration method includes:

S100: within a first time, a calibration circuit adjusts an impedance of a calibration resistance module according to an initial calibration signal to generate an initial output voltage.

For example, the first time is a time when the ZQ calibration circuit performs the ZQ calibration. During this time period, the calibration circuit can adjust the impedance of the calibration resistance module according to the initial calibration signal, thereby generating the initial output voltage. The initial calibration signal may be a calibration control code signal generated after the original ZQ calibration circuit in the chip completes once ZQ calibration, and the initial reference voltage is directly generated according to the calibration control code signal. In other embodiments, the third control code signal can also be generated according to the calibration control code signal, as long as at the moment of completing the ZQ calibration once, the generated initial reference voltage matches the resistance in the current calibration circuit.

S200: within the second time, the calibration circuit generates a corresponding reference voltage according to a first comparison signal, where an output voltage of the calibration resistance module varies with a first parameter, and the first parameter includes at least one of a fabrication process of the calibration circuit, a power supply voltage of the calibration circuit, or an operating temperature of the calibration circuit.

For example, the ZQ calibration circuit performs the ZQ calibration every predetermined time interval to generate a calibration signal, and a time interval between two adjacent ZQ calibrations is the second time. In this step, within the second time, the corresponding reference voltage is generated according to the first comparison signal, to ensure that the change of the output voltage can always be detected.

S300: compare the output voltage with the reference voltage and generate the first comparison signal.

Within the second time, the output voltage (such as the aforementioned first node voltage) is compared with the reference voltage to generate the first comparison signal. The first comparison signal can reflect the change of the output voltage of the calibration circuit, thereby reflecting the change of the resistance in the calibration circuit, and reflecting the real-time change of the PVT, to meet more accurate calibration requirements. The first comparison signal can be applied to a circuit sensitive to the change of the PVT, such as a high-speed interface circuit.

Figure 8:
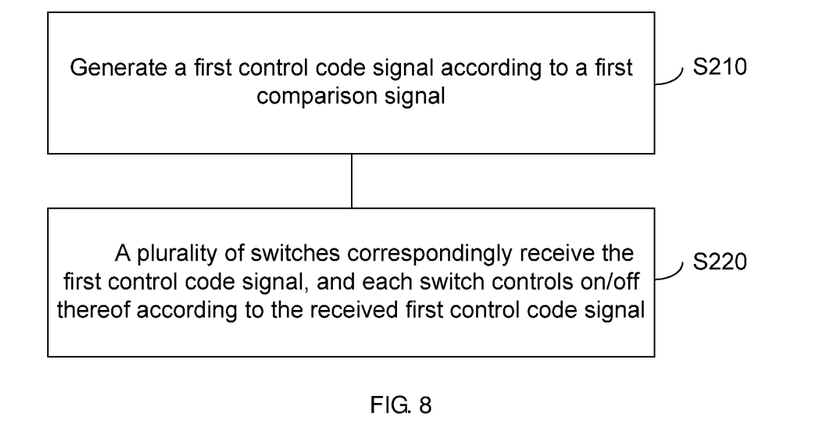
FIG. 8 is a flow diagram of a calibration method according to one exemplary embodiment.

In the embodiment that the reference voltage generation module of the calibration circuit includes a plurality of first resistors connected in series, where two ends of each of the first resistors are respectively connected in series to a switch, as shown in FIG. 8, step S200 specifically includes:

S210: generate a first control code signal according to the first comparison signal; and S220: the plurality of switches receive the first control code signal in a time-shared manner, and each switch controls on or off thereof according to the received first control code signal.

In this embodiment, the first control code signal is generated according to the first comparison signal, and the first control code signal is configured to control the on or off of each switch, thereby adjusting the number of the first resistors connected into the circuit in response to the first comparison signal, and adjusting the reference voltage. For example, in response to the change in the first comparison signal, the first control code signal is increased or decreased, for example, the operation of adding 1 or subtracting 1 is performed on the first control code signal. The first control code signal is employed to adjust the number of first resistors connected into the circuit, to change the reference voltage. After once adjustment is completed, if the output voltage of the calibration resistance module is equal to the reference voltage, the first comparison signal is no longer generated, and if the two are not equal, the first comparison signal is continued outputting, such that the operation of adding 1 or subtracting 1 to the first control code signal is continued, thereby continuing changing the reference voltage, until the output voltage is equal to the reference voltage. In this way, the first comparison signal can reflect dynamic change of the resistance of the calibration resistance module.

In this embodiment, to ensure that the calibration circuit can always monitor the change of the PVT during the calibration interval, the calibration circuit generates the corresponding reference voltage according to the first comparison signal in real time, such that the output voltage is equal to the reference voltage. Thus, when the output voltage of the calibration circuit changes again, the calibration circuit can still detect the voltage change of the output voltage, and accurately reflect the resistance change information of the calibration resistance module through the first comparison signal, such that the real-time change of the PVT can be monitored all the time.

In one exemplary embodiment of the present disclosure, before the calibration circuit generates the corresponding reference voltage according to the first comparison signal, the calibration method further includes: generating, by the calibration circuit, a corresponding initial reference voltage according to the initial calibration signal, the initial reference voltage being equal to the initial output voltage.

In this embodiment, the corresponding initial reference voltage is generated according to the initial calibration signal. In this way, in the subsequent comparison step, the initial output voltage can be compared with the initial reference voltage, such that the situation that the resistance in the calibration resistance module 100 changes for the first time after the completion of once ZQ calibration can be reflected.

In the embodiment that the reference voltage generation module of the calibration circuit includes a plurality of first resistors connected in series, where two ends of each of the first resistors are respectively connected in series to a switch, the generating, by the calibration circuit, a corresponding initial reference voltage according to the initial calibration signal includes:

determining a second control code signal according to the initial calibration signal; and correspondingly receiving, by the plurality of switches, the second control code signal, and controlling, by each of the switches, on or off thereof according to the received second control code signal.

In this embodiment, the second control code signal for controlling the on or off state of each switch is generated according to the initial calibration signal. Since the on or off states of the plurality of switches need to be controlled, the plurality of switches need to receive the second control code signal in a time-shared manner. For example, the second control code signal is a sequence, and the sequence includes switch signals respectively configured to control the switches. The switch signals are sequentially inputted into the switches according to timing of the sequence, thereby controlling the switches.

For example, the above process is described in detail by taking an example where there are 6 switches and 7 first resistors. The switches are turned on in response to a high level and turned off in response to a low level. If the second control code signal is [0, 0, 0, 0, 1, 1], the switch signal "0" is inputted into the first four switches in turn, and then the switch signal "1" is inputted into the last two switches in turn, such that the first four switches are in the off state, the last two switches are in the on state, and the first five first resistors and the last first resistor are connected into the circuit.

The present disclosure is described with reference to the flowcharts and/or block diagrams of the method, the apparatus (device), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct a computer or another programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

In the present disclosure, the terms "include", "comprise", or any other variations thereof are intended to cover a non-exclusive inclusion, such that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

The invention claimed is:

1. A calibration circuit, comprising:
a calibration resistance module, wherein an output voltage of the calibration resistance module varies with a first parameter, and the first parameter comprises at least one of a fabrication process of the calibration circuit, a power supply voltage of the calibration circuit, or an operating temperature of the calibration circuit;
a reference voltage generation module, configured to receive a first comparison signal, to generate a corresponding reference voltage; and
a comparison module, coupled to the calibration resistance module and the reference voltage generation module, and configured to compare the output voltage with the reference voltage and generate the first comparison signal, and
a latch, provided with an input terminal coupled to the comparison module and an output terminal coupled to an internal circuit, and configured to latch the first comparison signal in response to a variation of the first comparison signal and output the first comparison signal to the internal circuit at a corresponding time.

2. The calibration circuit according to claim 1, wherein the reference voltage generation module comprises a plurality of first resistors connected in series, wherein
at least one end of two ends of each of the first resistors are respectively connected to a switch, and when the switches at the two ends of the first resistor are both turned on, the first resistor is in a short-circuit state.

3. The calibration circuit according to claim 2, wherein the reference voltage generation module further comprises:
a first code generator, configured to generate a first control code signal in response to the first comparison signal, the first control code signal being configured to control on or off of each of the switches.

4. The calibration circuit according to claim 1, wherein the comparison module comprises:
a comparator, provided with an input terminal for receiving the output voltage and the reference voltage and an output terminal connected to a counter, and configured to compare the output voltage with the reference voltage to output a second comparison signal; wherein the counter is provided with an output terminal coupled to the reference voltage generation module, and is configured to count in response to the second comparison signal to generate the first comparison signal.

5. The calibration circuit according to claim 1, wherein the calibration resistance module comprises multiple calibration resistance submodules connected in parallel, the calibration resistance submodule comprises a transistor and a second resistor connected in series, and multiple transistors are all configured to be correspondingly turned on or off according to an initial calibration signal, to generate an initial output voltage.

6. The calibration circuit according to claim 1, wherein the reference voltage generation module is further configured to generate an initial reference voltage according to an initial calibration signal, the initial reference voltage being equal to an initial output voltage.

7. The calibration circuit according to claim 5, further comprising: a third resistor, coupled to the calibration resistance module, and having a resistance of 240 ohms with an accuracy of ±1%.

8. The calibration circuit according to claim 7, wherein the transistor is provided with a first terminal connected to a power supply terminal, a second terminal connected to one terminal of the second resistor, and a control terminal for receiving the initial calibration signal; and the other terminal of the second resistor is coupled to the third resistor.

9. The calibration circuit according to claim 7, wherein the transistor is provided with a first terminal connected to a ground terminal, a second terminal connected to one terminal of the second resistor, and a control terminal for receiving the initial calibration signal; and the other terminal of the second resistor is coupled to the third resistor.

10. A memory, comprising: a controller and the calibration circuit according to claim 1; wherein the controller is configured to send a calibration control signal to the calibration circuit.

11. A calibration method of a calibration circuit, comprising:
within a first time, adjusting, by the calibration circuit, an impedance of a calibration resistance module according to an initial calibration signal to generate an initial output voltage;
within a second time, generating, by the calibration circuit, a corresponding reference voltage according to a first comparison signal, wherein an output voltage of the calibration resistance module varies with a first parameter, and the first parameter comprises at least one of a fabrication process of the calibration circuit, a power supply voltage of the calibration circuit, or an operating temperature of the calibration circuit;
comparing the output voltage with the reference voltage, and generating the first comparison signal, and
before the generating, by the calibration circuit, a corresponding reference voltage according to a first comparison signal, the calibration method further comprises:
generating, by the calibration circuit, a corresponding initial reference voltage according to the initial calibration signal, the initial reference voltage being equal to the initial output voltage.

12. The calibration method according to claim 11, wherein a reference voltage generation module of the calibration circuit comprises a plurality of first resistors connected in series, wherein at least one end of two ends of each of the first resistors are respectively connected to a switch; and the generating, by the calibration circuit, a corresponding reference voltage according to a first comparison signal comprises:
generating a first control code signal according to the first comparison signal; and
correspondingly receiving, by a plurality of the switches, the first control code signal, and controlling, by each of the switches, on or off thereof according to the first control code signal received.

13. The calibration method according to claim 11, wherein a reference voltage generation module of the calibration circuit comprises a plurality of first resistors connected in series, wherein two ends of each of the first resistors are respectively connected in series to a switch; and
the generating, by the calibration circuit, a corresponding initial reference voltage according to the initial calibration signal comprises:
determining a second control code signal according to the initial calibration signal; and
correspondingly receiving, by a plurality of the switches, the second control code signal, and controlling, by each of the switches, on or off thereof according to the second control code signal received.

* * * * *